United States Patent [19]

Price et al.

[11] Patent Number: 4,680,486
[45] Date of Patent: * Jul. 14, 1987

[54] COMBINATIONAL LOGIC CIRCUITS IMPLEMENTED WITH INVERTER FUNCTION LOGIC

[75] Inventors: John E. Price, Palo Alto; Larry W. De Clue, Saratoga, both of Calif.

[73] Assignee: Amdahl Corporation, Sunnyvale, Calif.

[*] Notice: The portion of the term of this patent subsequent to Aug. 12, 2003 has been disclaimed.

[21] Appl. No.: 588,919

[22] Filed: Mar. 12, 1984

[51] Int. Cl.[4] ................. H03K 19/092; H03K 19/086; H03K 17/60
[52] U.S. Cl. .................................. 307/475; 307/455; 307/446
[58] Field of Search ............... 307/443, 446, 454, 455, 307/467, 475

[56] References Cited

U.S. PATENT DOCUMENTS

| | | | |
|---|---|---|---|
| 3,648,064 | 3/1972 | Mukai et al. | 307/446 X |
| 3,649,844 | 3/1972 | Kroos | 307/471 |
| 3,716,722 | 2/1973 | Bryant et al. | 307/443 |
| 3,755,693 | 8/1973 | Lee | 307/446 X |
| 3,906,212 | 9/1975 | Poguntke | 307/455 X |
| 4,112,314 | 9/1978 | Gani et al. | 307/446 |
| 4,435,654 | 3/1984 | Koide | 307/443 X |
| 4,494,017 | 1/1985 | Montegari | 307/455 X |
| 4,605,871 | 8/1986 | Price et al. | 307/443 |

FOREIGN PATENT DOCUMENTS 148427 9/1982 Japan .................. 307/455

OTHER PUBLICATIONS

Itou et al, "ECL LSI Circuit Design", *Review of Electrical Communication Labs;* vol. 26, Nos. 9–10; pp. 1339–1354; Sep.–Oct./1978.
Mukai et al, "Master Slice ECL LSI"; Review of Electrical Communication Labs.; vol. 26, Nos. 9–10; pp. 1325–1338; Sep.–Oct./1978.

*Primary Examiner*—Stanley D. Miller
*Assistant Examiner*—David R. Bertelson
*Attorney, Agent, or Firm*—Fliesler, Dubb, Meyer & Lovejoy

[57] ABSTRACT

Combinational logic circuits are implemented with Inverter Function Logic gates. Such circuits may utilize the logical complement of an input signal in the logical operation performed by the gate without having to use a separate inverter stage or a dual level Cascode arrangement. If such circuits employ the feature of collector dotting, diode clamps are not required. Combinational logic circuits fabricated with Inverter Function Logic utilize a level shifted transistor means in lieu of the standard reference transistor of ECL gates so that input voltages are compared with each other rather than with a reference voltage. In one embodiment the level shifted transistor means comprises a transistor having a level shifted representation of an input signal whose complement is to be used in the logical operation applied to its base. In another embodiment the level shifted transistor means comprises a transistor having a Schottky diode connected between its emitter and the common emitter connection of the input transistors.

4 Claims, 34 Drawing Figures

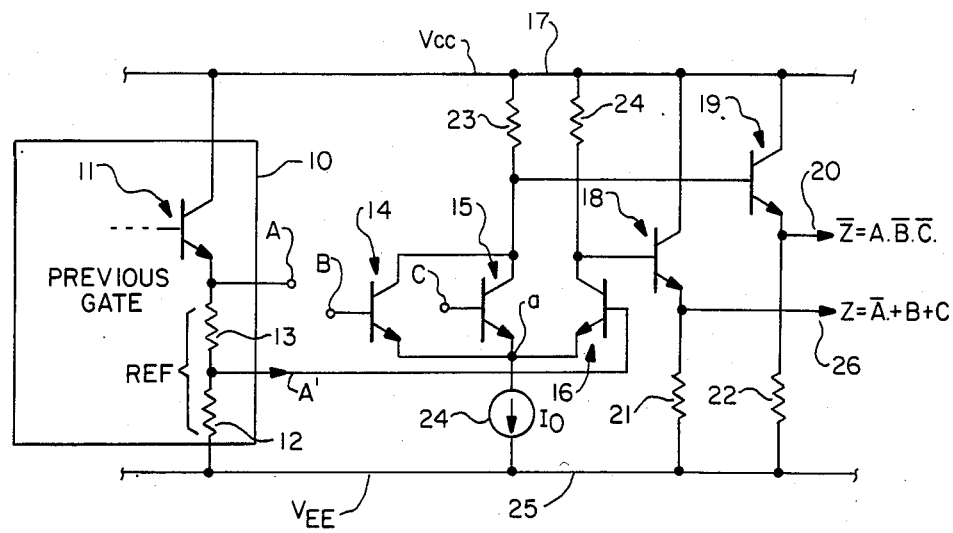
FIG.—1
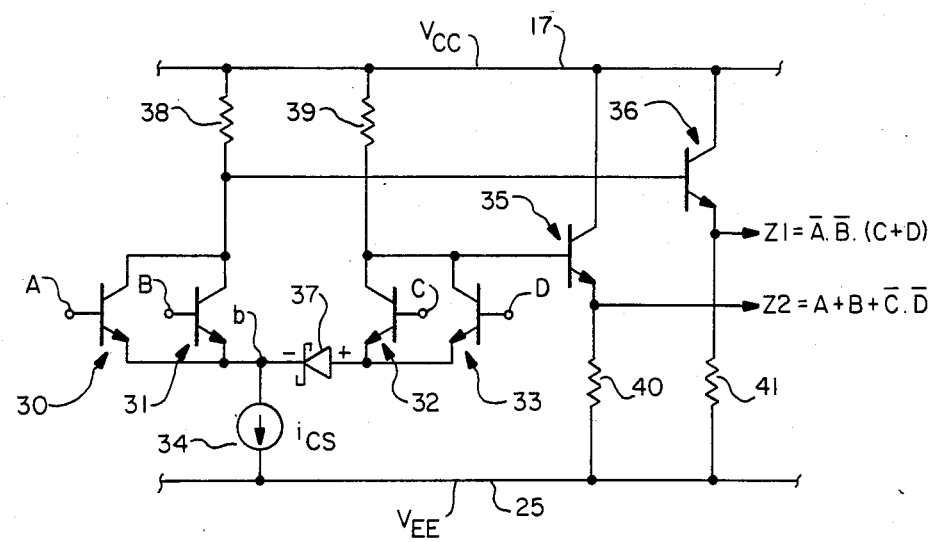
FIG.—2

AND FUNCTIONS
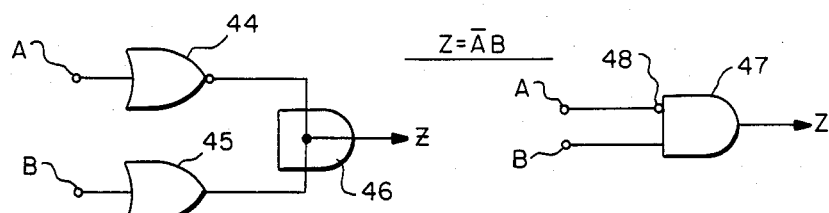
FIG.-3a  FIG.-3b
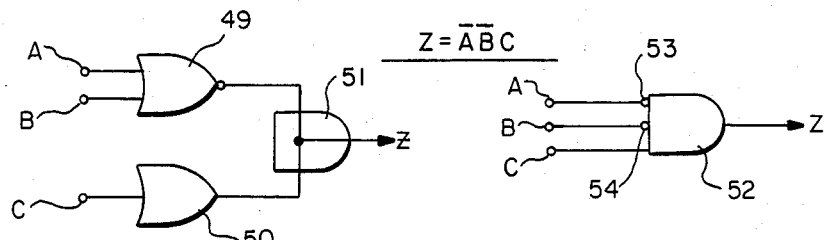
FIG.-4a  FIG.-4b
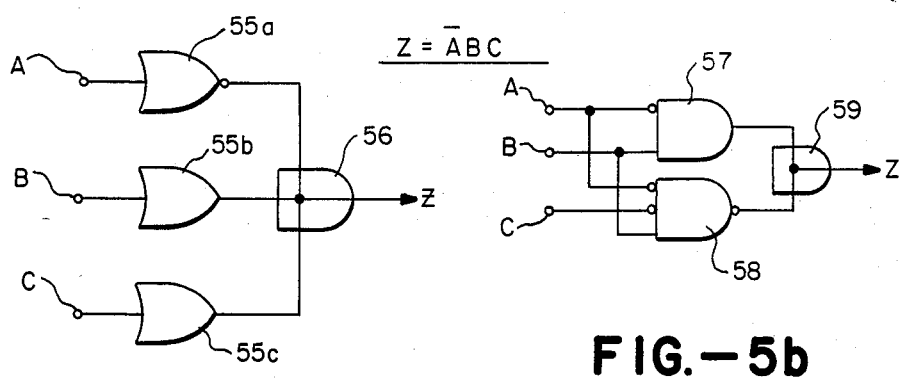
FIG.-5a  FIG.-5b
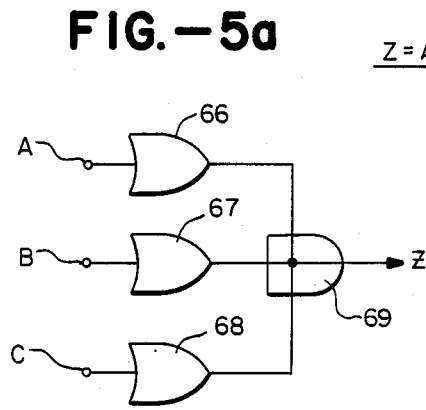
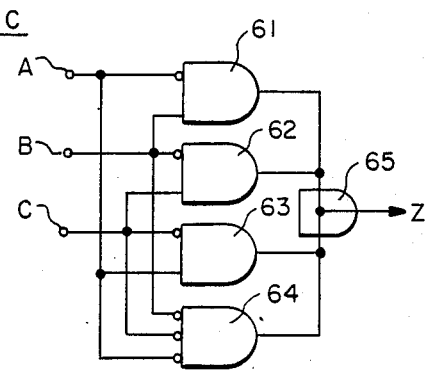
FIG.-6a  FIG.-6b U.S. Patent Jul. 14, 1987 Sheet 3 of 9 4,680,486
$Z = A \cdot B$
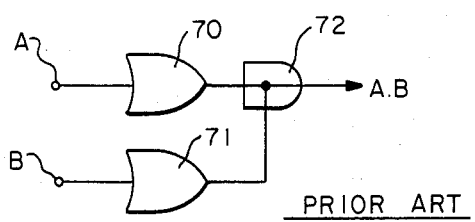
FIG.—7 PRIOR ART
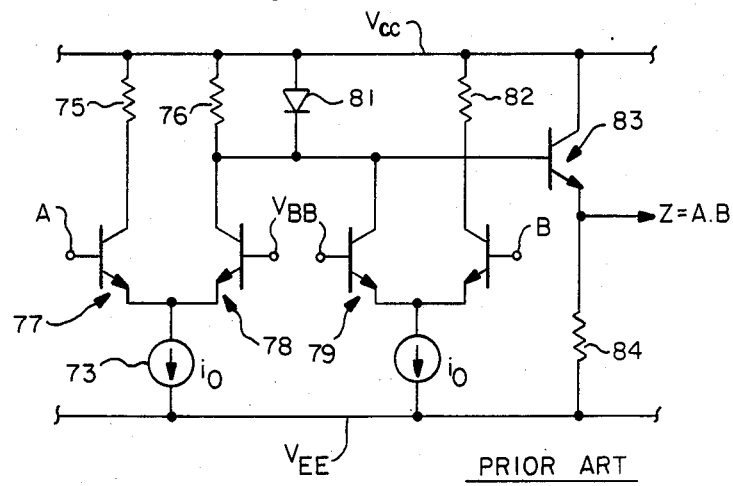
FIG.—8 PRIOR ART
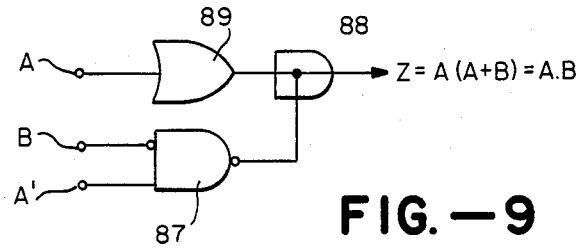
$Z = A(A+B) = A \cdot B$
FIG.—9
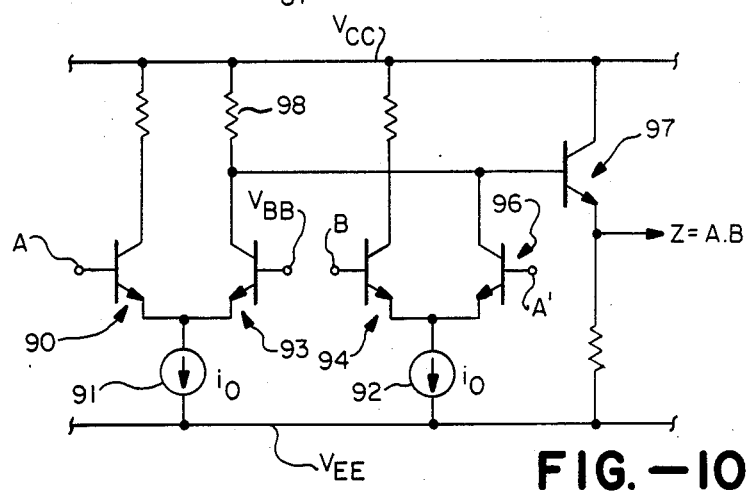
FIG.—10

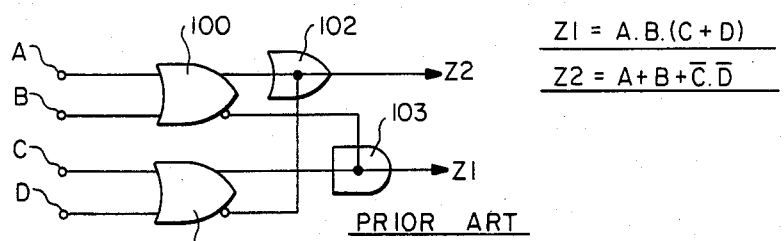
$$Z1 = A.B.(C+D)$$
$$Z2 = A+B+\overline{C}.\overline{D}$$
FIG. —11 PRIOR ART
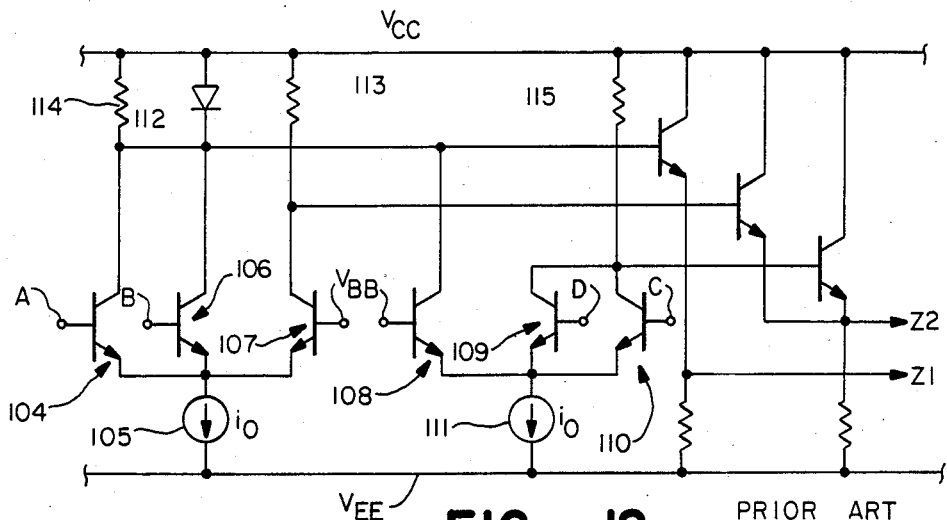
FIG. —12 PRIOR ART
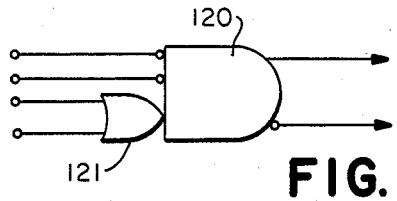
FIG. —13
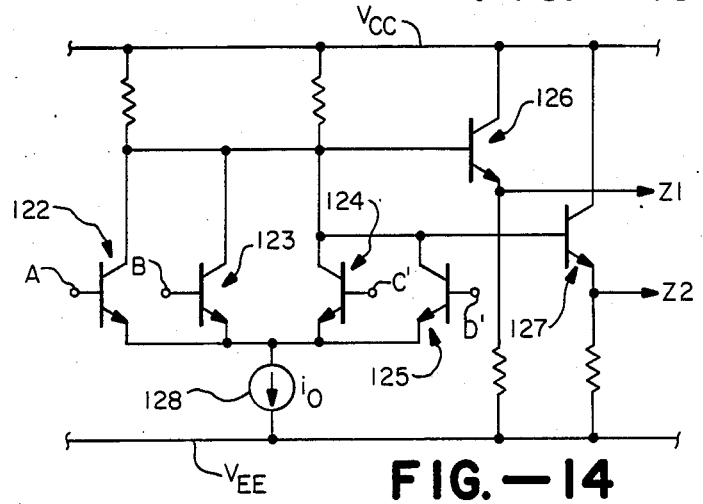
FIG. —14

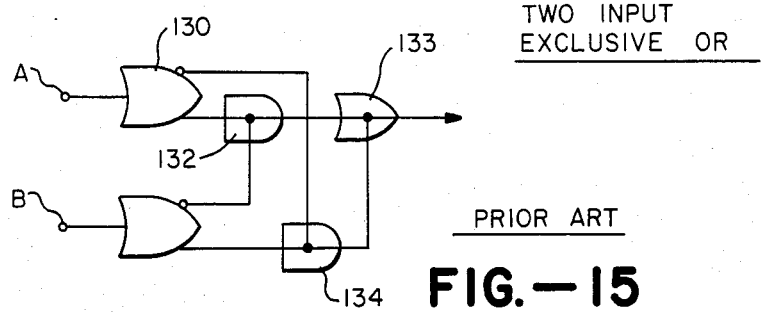
TWO INPUT EXCLUSIVE OR
PRIOR ART
FIG.—15
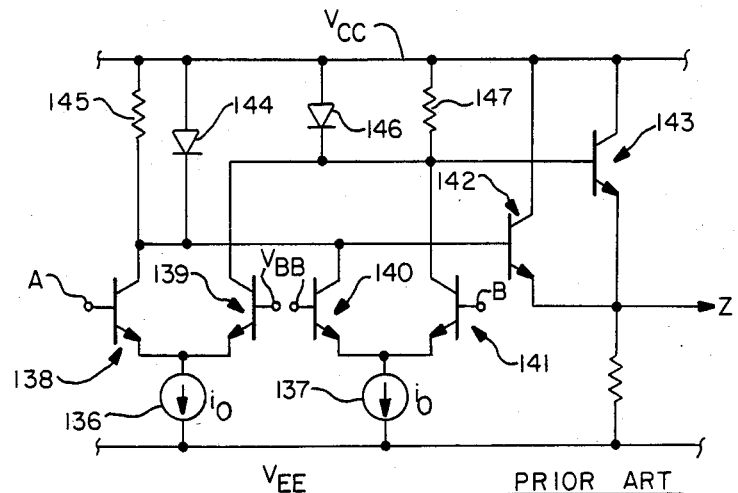
PRIOR ART
FIG.—16
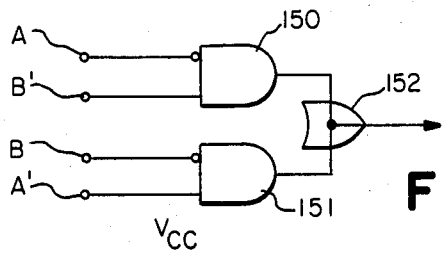
FIG.—17
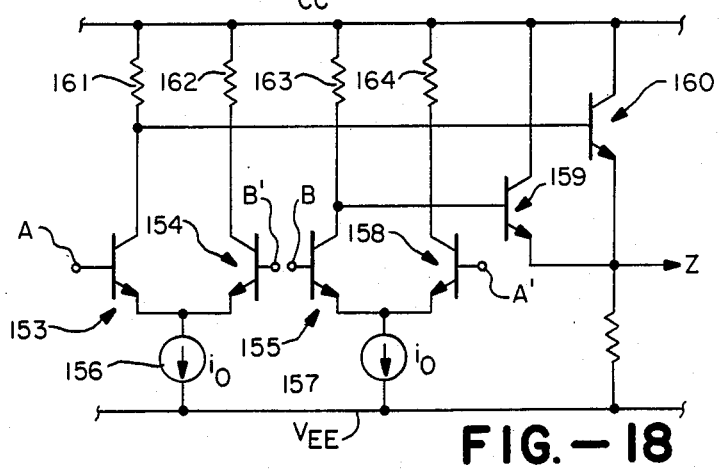
FIG.—18

TWO INPUT EXCLUSIVE NOR

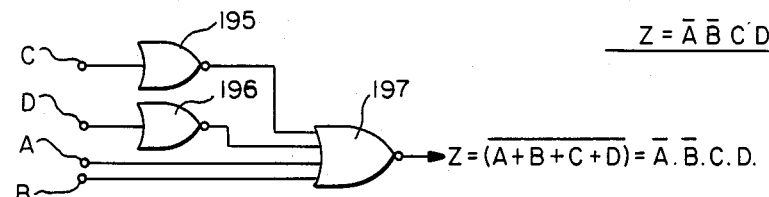
FIG. −23  PRIOR ART
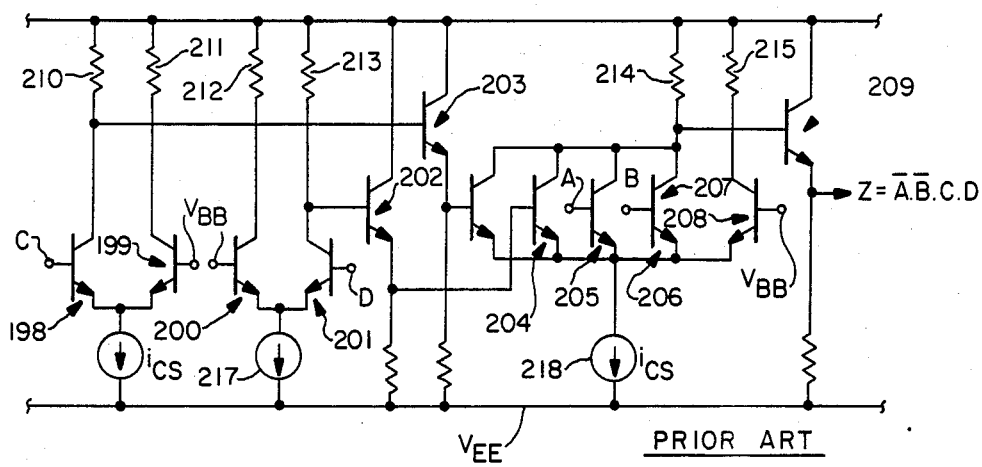
FIG. −24  PRIOR ART
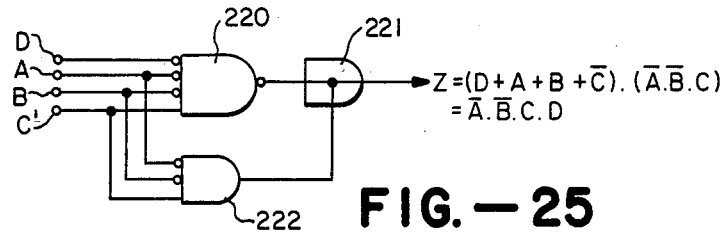
FIG. −25
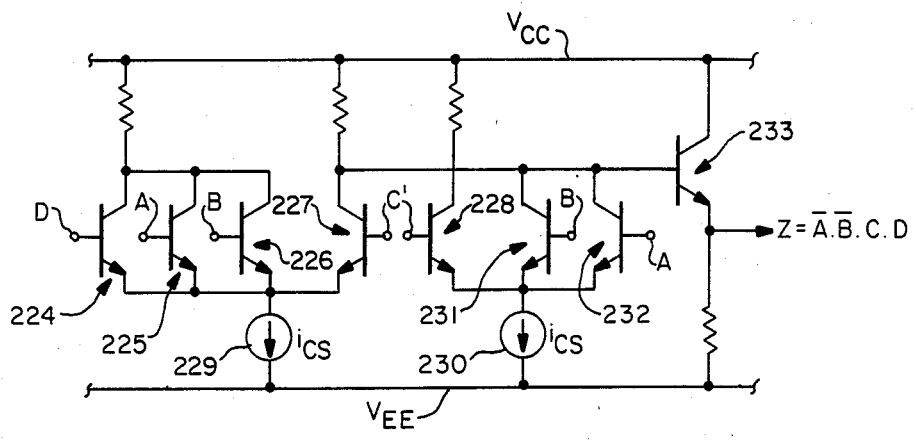
FIG. −26

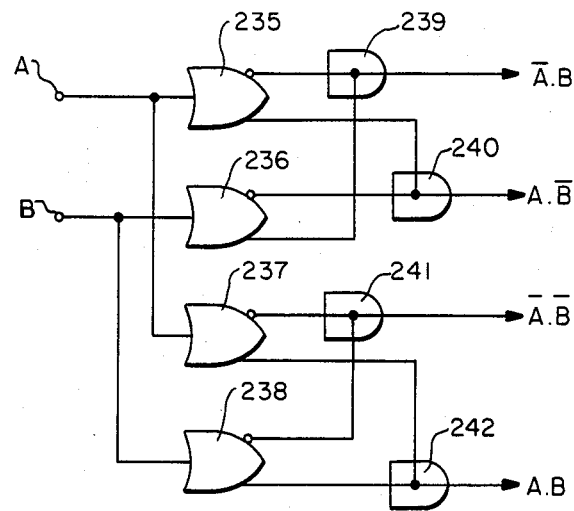
PRIOR ART
FIG.—27
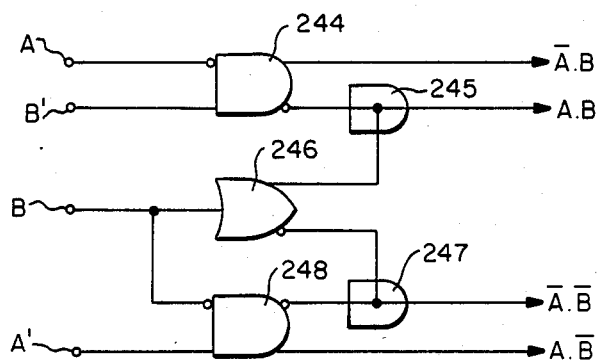
FIG.—28

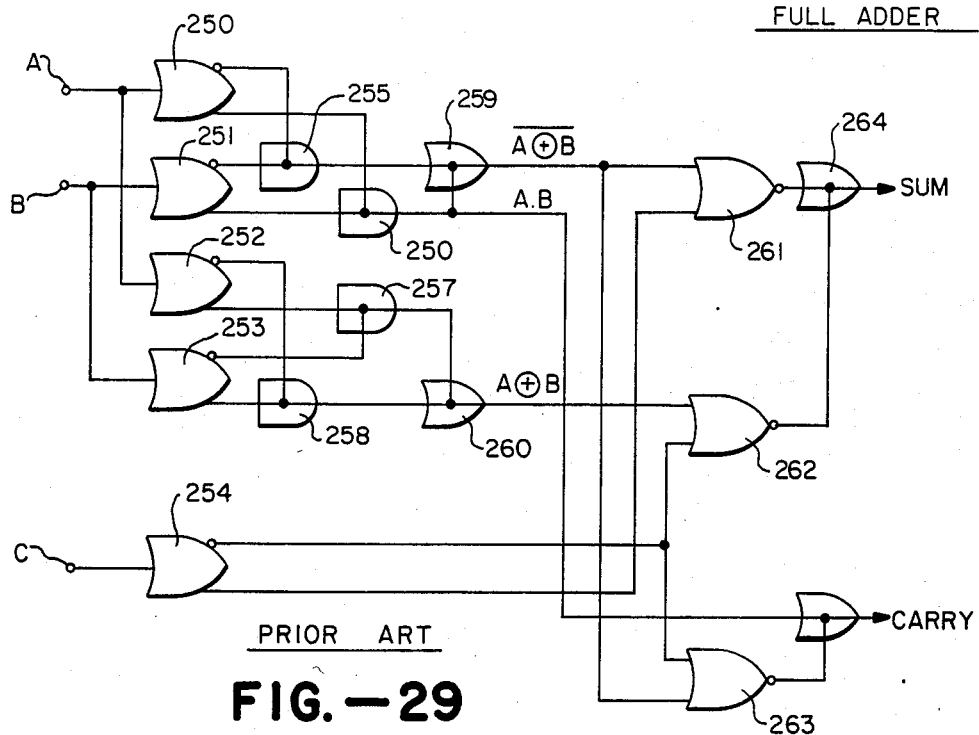
FIG.—29 PRIOR ART
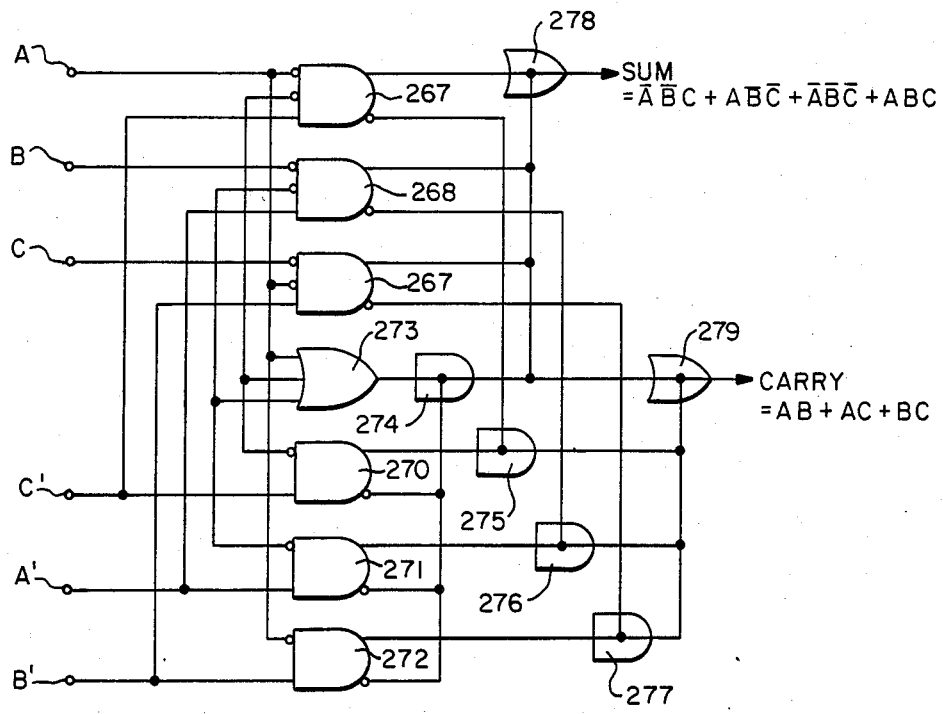
FIG.—30

COMBINATIONAL LOGIC CIRCUITS IMPLEMENTED WITH INVERTER FUNCTION LOGIC

BACKGROUND OF THE INVENTION

1. Field of the Invention

This invention relates to combinational logic circuits iplemented with logic gates which are a variation of ECL and, more particularly, relates to combinational logic functions such as Exclusive ORs, Adders and Decoders which are implemented with logic gates capable of performing a logical operation involving the complement of an input variable.

Digital computers utilize both combinational and sequential logic circuits in their processing units. Combinational logic circuits perform a predetermined logical operation upon a number of inputs each of whose voltage levels signify at least two different states. The combinational logic circuits promptly produce an immediate output of the result of the logical operation. Typically, combinational logic functions are carried out by intergrated circuit logic gates of the types which are implemented in one of the popular logic families such as transistor-transistor logic, emitter-coupled logic, resistor-transistor logic, emitter-coupled logic, resistor-transistor logic or which are implemented with particularized logic gates such as those disclosed in Z. E. Skokan, "Logic Gate", U.S. Pat. No. 3,643,109. See generally D. A. Hodges et al., *Analysis and Design of Digital Integrated Circuits*, Chaper 7, "Bipolar Digital Gate Circuits", (McGraw-Hill 1983); and H. W. Gschwind et al., *Design of Digital Computers*, pp. 64–100. In a typical digital computer, integrated circuit logic gates based on various logic families may be utilized, especially if they are available off the shelf. Where customized circuits are fabricated, due to process limitations or to the desire to simplify the interconnection schemes, it is at times desirable to utilize a single logic family when implementing both combinational and sequential logic circuits. Such a universal logic gate having unique properties and based upon a variation of ECL logic is disclosed in the co-pending application of J. E. Price and L. W. DeClue, "Inverter Function Logic Gate", filed on Mar. 12, 1984 and assigned Ser. No. 588,476. Briefly, an individual inverter function logic gate is capable of performing logical operations on the complement of one or more of the input variables without having to use a discrete inverter or dual level Cascode logic to produce the complement of the input variable. Such individual inverter function logic gates may be combined to fabricate combinational logic circuits which have preferential properties over prior art combinational logic circuits.

Combinational logic circuits include functions such as Exclusive ORs, Decoders, Adders, AND functions and the like. The logical operation of combinational logic circuits are well known, particularly for two-valued Boolean functions. In practice, most integrated circuits are based on such two-valued functions, although tri-state and higher order devices may be implemented. See, e.g., H. W. Gschwind et al., *Design of Digital Computers*, pp. 42–45 (Springer-Verlag 1975); and D. A. Hodges et al., *Analysis and Design of Digital Integrated Circuits*, pp. 2–12 (McGraw-Hill 1983). Combinational logic circuits may be implemented generally by means based upon various types of physical effects. Thus, mechanical, electrical, magnetic, optical, acoustic, or cyrogenic means may be used. Electrical implementation, and particularly implementation with integrated circuits fabricated with bipolar logic of inverter function logic format, as described below, is contemplated in the present invention.

When combinational logic circuits are implemented in an integrated circuit format, they are typically based on one or more of the basic bipolar logic families. For high performance digital computers and other applications where high speed is desired, a logic family of choice would be emitter-coupled logic. Combinational circuits implemented in emitter-coupled logic, the bipolar logic family with the highest speed are shown, for example, in the prior art of FIGS. 7-8, 11-12 and 15-16. Commercial examples of ECL-based logic devices are the 8-Bit Comparator Am25LS2521 of Advanced Micro Devices and the One-of-Eight Decoder Am2921 of Advanced Micro Devices.

For conventional ECL-based combinational circuits, it is the prevailing practice to accomplish the AND function in positive notation by connecting together certain collectors of transistors within the ECL gate; this practice is called collector dotting. See A. H. Seidman, *Integrated Circuits Handbook*, pp. 74–75 (Wiley 1983). Whenever collector dotting is utilized it is usually necessary to employ a diode clamp (diode 81 in FIG. 8; diodes 144 and 146 in FIG. 16) to prevent excessive currents from passing through load resistors. Also, whenever the complement of an input function is to be included in the logical operation of the circuit, it is necessary to utilize either a separate inverter or a dual level Cascode logic arrangement. And, the number of gates required to implement combinational logic functions in conventional ECL-based logic may be undesirably high.

It is therefore an object of the present invention to provide a combinational logic circuit which incorporates a variation of an ECL logic gate which does not require the use of a diode clamp when collector dotting is utilized in the circuit.

It is another object of the present invention to provide a combinational logic circuit which will allow a logical operation to be carried out on the input signals including the complement of an input signal without the use of a separate inverter or a Cascode logic arrangement.

It is yet another object of the present invention to provide a combinational logic circuit which implements combinational logic functions with fewer gates than conventional ECL-based logic gates.

It is still another object of the present invention to provide a combinational logic circuit which does not require the distribution of a $V_{BB}$ supply line to the gate.

BRIEF DESCRIPTION OF THE DRAWING

For a more complete understanding of a combinational logic gate of the present invention, reference may be had to the accompanying drawings which are incorporated herein by reference and in which:

FIG. 1 is an individual inverter function logic gate;

FIG. 2 is an alternate embodiment of an individual inverter function logic gate;

FIG. 3a is a logic diagram of a two-input AND gate performing the function $Z=\bar{A}.B$ as implemented with ECL logic gates;

FIG. 3b is the logic diagram of the two input AND gate of FIG. 3a as implemented with an Inverter Function Logic (IFL) gate;

FIG. 4a is the logic diagram of a three-input AND gate which performs the function $Z=\overline{A}.\overline{B}.C$ as implemented with ECL logic gates;

FIG. 4b is the logic diagram of the AND gate of FIG. 4a as implemented with an IFL gate;

FIG. 5a is the logic diagram of a three-input AND gate for the function $Z=\overline{A}.B.C$ as implemented with ECL gates;

FIG. 5b is the logic diagram of the function of FIG. 5a as implemented with IFL gates;

FIG. 6a is the logic diagram of a three-input AND gate for the function $Z=A.B.C$ as implemented with ECL logic gates;

FIG. 6b is the three-input AND gate of FIG. 6a as implemented with IFL gates;

FIGS. 7-10 are logic and circuit schematic diagrams which represent the implementation of the logic function $Z=A.B$ in which:

FIG. 7 is the logic diagram for an ECL-based circuit of the prior art;

FIG. 8 is the circuit schematic for the logic diagram of FIG. 7;

FIG. 9 is the logic diagram for an IFL-based circuit;

FIG. 10 is the circuit schematic for the IFL-based circuit of FIG. 9;

FIGS. 11-14 are logic and circuit schematic diagrams which represent the implementation of the logic function $Z1=\overline{A}.\overline{B}(C+D)$ and $Z2=A+B+\overline{C}.\overline{D}$ in which:

FIG. 11 is the logic diagram for an ECL-based circuit of the prior art;

FIG. 12 is the circuit schematic for the logic diagram of FIG. 11;

FIG. 13 is the logic diagram for an IFL-based circuit;

FIG. 14 is the circuit schematic for the IFL-based circuit of FIG. 13;

FIGS. 15-18 are logic and circuit schematic diagrams which represent the implementation of the Exclusive OR function $Z=A.\overline{B}+\overline{A}.B$ in which:

FIG. 15 is the logic diagram for an ECL-based circuit of the prior art;

FIG. 16 is the circuit schematic for the logic diagram of FIG. 15;

FIG. 17 is the logic diagram for an IFL-based circuit;

FIG. 18 is the circuit schematic for the IFL-based circuit of FIG. 17;

FIGS. 23-26 are logic and circuit schematic diagrams which represent the implementation of the logic function $Z=\overline{A}.\overline{B}.C.D$ in which:

FIG. 23 is the logic diagram for an ECL-based circuit of the prior art;

FIG. 24 is the circuit schematic for the logic diagram of FIG. 23;

FIG. 25 is the logic diagram for an IFL-based circuit;

FIG. 26 is the circuit schematic for the IFL-based circuit of FIG. 25;

FIG. 27 is the logic diagram for an ECL-based Active High ¼ Decoder;

FIG. 28 is the logic diagram for an Active High ¼ Decoder as implemented with IFL logic;

FIG. 29 is the logic diagram for a Full Adder as implemented with ECL-based gates; and FIG. 30 is a logic diagram for the Full Adder of FIG. 29 as implemented with IFL gates.

SUMMARY OF THE INVENTION

Figure 19:
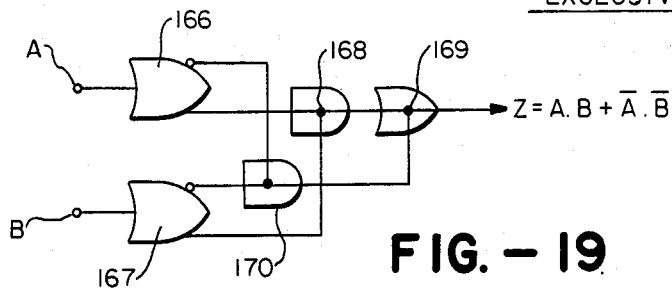
FIG. 19 is the logic diagram for a two-input Exclusive NOR gate based on ECL logic of the prior art.

Combinational logic circuits are implemented with Inverter Function Logic gates, a variation of ECL. Such circuits may perform a logical operation on the logical complement of an input signal without having to use a separate inverter stage or a dual level Cascode arrangement. If such circuits employ the feature of collector dotting, diode clamps are not required. Combinational logic circuits in accordance with the present invention incorporate an Inverter Function Logic gate which utilizes a level shifted transistor means in lieu of the standard reference transistor of ECL gates. Input signals at conventional ECL levels are provided on the bases of the input transistors. Thus, input signals are compared with each other rather than with a reference voltage. In one embodiment the level shifted transistor means comprises a transistor having a level shifted representation of the input signal applied to its base. In another embodiment the level shifted transistor means comprises a transistor having a Schottky diode connected between its emitter and the common emitter connection of the input transistors. The number of gates is generally reduced thereby reducing power consumption and lessening propagation delay.

DESCRIPTION OF THE PREFERRED EMBODIMENTS

Alternative embodiments of the inverter function logic gate utilized here to implement combinational logic circuits are shown in FIGS. 1 and 2. Each figure shows a combinatorial logic circuit which is based on the inverter function logic principle and utilizes the complement of an input signal. In FIG. 1 a level shifted representation A' of the output A from previous gate 10 is obtained by dividing the output A across resistors 13 and 14. The tapped voltage representing A' is applied to the base of transistor 16 which is the reference transistor in standard ECL configurations but is the level shift input transistor in the IFL implementation. As a result, the comparison carried out at node a is of input signals with themselves, i.e., input signal B and C is compared with a level shifted representation A' of input signal A. The OR output $Z=\overline{A}+B+C$ is available on terminal 26 connected to the emitter of output emitter follower 18. The NOR output $\overline{Z}=\overline{A}.\overline{B}.\overline{C}$ is available at terminal 20 connected to the emitter of output emitter follower 19. In the alternative embodiment, shown in FIG. 2, the level shift of the input signals C and D is accomplished by placing a Schottky diode 37 between the emitters of level shift input transistors 32 and 33 and the node b. Here also, the input signals A and B are compared with other input signals, i.e., the level shifted representations of input signals C and D. The output $Z1=\overline{A}.\overline{B}(C+D)$ is available on the terminal connected to the output of emitter follower 36. The output $Z2=A+B+\overline{C}.\overline{D}$ is available on the terminal connected to the emitter of emitter follower 35. In neither case is it necessary to distribute a reference voltage $V_{BB}$ to the individual gate to carry out the logic function. In the embodiment of FIG. 1 there is a local distribution of the level shifted representation A' from the previous gate to level shift input transistor 16. In a most preferred embodiment the resistors 13 and 12 are located adjacent the base of level shift input transistor 16 so that the RC time constant associated with these resistors and the transmission line is minimized. With both embodiments the complement of an input signal has been included in a logical operation without having had to use a separate inverter stage or dual level Cascode arrangement. Thus, in FIG. 1, the complement of the input A has been used and in FIG. 2 the complements of the input signals C and D have been used.

In the implementation of combinational logic circuits, it is desirable to design the logic around the circuit principles of the basic gate. The design objectives are to obtain minimum gate counts, minimum circuit delays, low power operation and, if possible, implementation without having to use a standard reference transistor which requires the distribution of a reference voltage such as $V_{BB}$ to each individual gate. For certain applications, all these desiderata are not realized even with the most powerful bipolar logic family, emitter-coupled logic. These cases include the situations where the complement of an input variable is required to be used in the logical function, e.g., for implementation of the logical operation $Z=\overline{A}.\overline{B}.C.D$; here, dual level Cascode logic or a separate inverter stage are required. The use of diode clamps to prevent excessive currents from passing through certain collector resistors in the case of collector dotting is extremely undesirable because the diode stores charge which introduces an additional time delay when logical operations are performed.

A given logical operation may be designed around a particular logic gate in multiple ways. The desiderata set out in the preceding paragraph may be realized to greater or lesser extent depending upon the quality of the particular design. And tradeoffs may have to be made in any given implementation. Thus, minimum gate count may be achieved at the expense of additional power consumption. Or, chip area may be minimized at the expense of propagation delay, and the like. Thus, many different species of combinational logic circuits are possible to be implemented with Inverter Function Logic gates for the same logical operation, each having its own particular areas of optimization and yet each based on IFL circuit principles. Of course, many species are possible for each different logical operation and there are many different logical operations.

Figure 22:
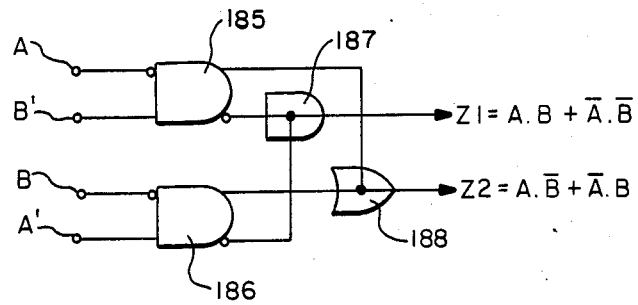
FIG. 22 is the Exclusive OR/Exclusive NOR circuit of FIG. 21 as implemented in IFL logic gates.

A principal benefit of the utilization of inverter function logic gates in arranging combinatorial logic circuits is shown in various sequences of the figures including FIGS. 7–10, FIGS. 11–14 and FIGS. 15–18. In each case, a prior art ECL-based version of a combinational logic circuit is shown in the first Figure of the series. A circuit schematic of the ECL implementation is shown in the second Figure of the series. The third figure of the series shows the IFL-based diagram of the same logic function. And the fourth Figure of each series shows the IFL-based circuit schematic. In each case shown in these series, the ECL-based implementation requires the use of a diode clamp in the connections between the collectors of the input or reference transistors and the voltage supply line $V_{CC}$. Throughout this specification when an AND gate has lines connected internally with a dot whether in an ECL or in an IFL logic diagram, the circuit principle of collector dotting is signified. Thus, for example, AND gate 187 in FIG. 22 as well as AND gate 132 in FIG. 15 signify collector dotting. This technique is adopted to reduce the number of gates and minimize power consumption. In the circuit schematics, for example, in FIG. 8 diode 81 is connected between the common collector connection of transistors 78 and 79 and the $V_{CC}$ supply line to prevent excessive current from flowing through resistor 76 and causing excessive voltage across resistor 76. Such excessive current could occur under the condition that both logic signals A and B are below the reference voltage level $V_{BB}$ in which case both transistors 78 and 79 would conduct. This is a condition which is possible in virtually all ECL-based circuits. As shown in FIG. 10, the IFL-based implementation of the same logic function, no diode clamp is required because the condition will never exist that A will be lower than $V_{BB}$ and A' will be higher than B so that current will flow through transistors 93 and 96 at the same time. Thus, resistor 98 will never have the current from current sources 91 and 92 flowing through it simultaneously. Similarly, in the prior art ECL-based circuit schematic of the functions $Z1=\overline{A}.\overline{B}.(C+D)$ and $Z2=A+B+\overline{CD}$ shown in FIG. 12, a diode 112, is connected between the common collector connections of transistors 104, 106 and 108 and the $V_{CC}$ voltage supply line. Under the condition that either input signal A or B is high, the current from current source 105 will flow through either or both of transistors 104 and 106 and thence through resistor 114 to the voltage supply line $V_{CC}$. Since at the same time input signals D and C are given as low, the current from current source 111 will flow through transistor 108 and also through resistor 114 to the $V_{CC}$ supply line. Diode clamp 112 has a forward conduction level which will prevent excessive current from flowing through resistor 114 and will carry the excess current if the above-mentioned condition occurs. By contrast, the IFL-based implementation in FIG. 14 accomplishes the same logic function yet does not require a diode clamp since the condition will never exist that excessive current will flow through either of the resistors tied to the $V_{CC}$ supply line since there is only a single current source 128. And, in FIG. 16 the ECL-based implementation of the two-input Exclusive OR function $Z=A.\overline{B}+\overline{A}.B$ is shown to have two diode clamps. Diode 144 is connected between the common collector connection of transistors 138 and 140 and the $V_{CC}$ supply line. Diode 146 is connected between the common collector connection of transistors 139 and 141 and the $V_{CC}$ supply line. Diode 144 protects resistor 145 against excessive current from both current sources 136 and 137 which would occur under the condition that the input signal A is high and the input signal B is low. Diode 146 protects resistor 147 which would experience excessive current from both of current sources 136 and 137 under the condition that the input signal B is high and the input signal A is low. No diode is required in the IFL-based implementation of the same logic function as shown in FIG. 18. Here, the current from transistor 153 flows through resistor 161 to the supply line $V_{CC}$, current through transistor 154 flows through resistor 162 to the $V_{CC}$ supply line, current through transistor 155 flows through resistor 163 to the $V_{CC}$ supply line and current through transistor 158 flows through resistor 164 to the $V_{CC}$ supply line. The benefit of elimination of diode clamps is obtained both for circuits where the additional advantage of using the complement of an input signal is obtained, as shown in FIGS. 11–14 and FIGS. 15–18, and also for cases where there is no need to use the complement of an input, as shown in FIGS. 7–10. The utilization of IFL logic gates in accomplishing combinatorial logic functions produces material benefit by providing the circuit designer with means to avoid having themselves, there is an abundant use of the complemented input feature in order to carry

TABLE I

| Function | IFL Figure | No. of Gates | ECL Figure | No. of Gates | No. of Complements Used | Gate Savings |
|---|---|---|---|---|---|---|
| AB | 3b | 1 | 3a | 3 | 1 | 2 |
| ABC | 4b | 1 | 4a | 3 | 2 | 2 |
| ABC | 5b | 3 | 5a | 4 | 1 | 1 |
| ABC | 6b | 5 | 6a | 4 | 0 | −1 |
| AB | 9 | 3 | 7 | 3 | 0 | 0 |
| AB (C+D) A+B+CD | 13 | 2 | 11 | 4 | 2 | 2 |
| AB + AB | 17 | 3 | 15 | 5 | 2 | 2 |
| AB + AB | 20 | 3 | 19 | 5 | 2 | 2 |
| AB + AB  AB + AB | 22 | 4 | 21 | 10 | 2 | 6 |
| ABCD | 25 | 3 | 23 | 3 | 2 | 0 |
| AB, AB, AB, AB | 28 | 5 | 27 | 8 | 2 | 3 |
| ABC + ABC + ABC +ABC  AB + AC + BC | 30 | 13 | 29 | 16 | 3 | 3 | to design in diodes to serve as diode clamps as well as with means to readily implement logical operations with the complement of an input variable.

It is known that in ECL-based logic it is not possible to obtain the complement of an input signal and use it in the logical operation without first providing a separate inverter stage or arranging a dual level Cascode logic arrangement. Thus, on ECL-based logic diagrams of the prior art as shown, for example, in FIGS. 7, 11, 15, 19, 23, 27 and 29, there are no circular symbols on the inputs of the various OR/NOR gates. The structure and function of such OR/NOR ECL gates is well known in the art and is described, for example, at D. A. Hodges et al., *Analysis and Design of Digital Integrated Circuits*, Sec. 7.4, "Emitter-Coupled Logic", p. 271 et seq. (McGraw-Hill 1983). In contrast, each of the equivalent logic diagrams based on IFL gates are able to provide an inverted input and, therefore, for example, there are circular symbols on the B input line of AND gate 47 in FIG. 9; the A and B input lines on AND gate 120 in FIG. 13; the A input line on AND gate 150 and the B input line on AND gate 151 in FIG. 17; the D, A and B input lines on AND gate 220 and the A and B input lines on AND gate 222 in FIG. 25; and on other input lines of the remaining IFL-based logic diagrams of the Figures. The use of IFL gates thus generally simplifies the logic diagrams as well as the associated circuit schematics, especially where use is made in the logical operation of the complement of the input signal. Thus, by comparing FIGS. 11 and 13, 15 and 17, 19 and 21, 21 and 22, 23 and 25, 27 and 28, 29 and 30, it can be seen that there is a reduction in gate count ranging from two to six gates. By comparing FIGS. 7 and 9 it can be seen that there is no reduction in gate count in the IFL implementation but the diode clamp is eliminated. Also, fewer current sources are usually required. Thus, by comparing the prior art of FIG. 12 with the IFL-based implementation of FIG. 14, it is seen that a pair of current sources 105 and 111 are replaced by single current source 128. And by comparing the prior art of FIG. 24 with the IFL-based implementation of FIG. 26, it can be seen that the three current sources 216, 217 and 218 are replaced by the two current sources 229 and 230.

Specific examples of IFL-based logic gates are shown in the Figures. A summary of the features of these IFL-based gates as compared to ECL-based gates is shown in the accompanying Table I. As seen from the Figures It is clear from Table I that all combinational logic functions are not necessarily optimally implemented with IFL logic gates. Gate savings generally occur when one or more complemented inputs are used in the logical operation. Of course, additional gates may be tolerated when the desired objective is the elimination of diode clamps. The circuit designer simply has another structural tool to use when accomplishing combinational logic circuits.

The elimination of the requirement that the reference voltage $V_{BB}$ be supplied to reference transistors is shown in the figures. In the prior art implementation of the logic function Z=A.B, shown in FIG. 8, the reference voltage $V_{BB}$ is applied to the bases of transistors 78 and 79. The IFL implementation, shown in FIG. 10, has only a single reference voltage $V_{BB}$ applied to the base of transistor 93. Instead, the level shifted representation A' is applied to the base of transistor 96. In the prior art ECL implementation of the logic functions $Z1=\overline{A}.\overline{b}(C+D)$ and $Z2=A+B+\overline{C}.\overline{D}$, shown in FIG. 12, the reference voltage $V_{BB}$ is applied to the bases of transistors 107 and 108. In contrast, in the IFL implementation, shown in FIG. 14, no reference voltage $V_{BB}$ is required. Instead, the level shifted representations of the input voltages C, D, designated C', D', are provided on the bases, respectively, of transistors 124 and 125. And, in the two-input exclusive OR logical function as implemented in ECL logic, shown in FIG. 16, the reference voltage $V_{BB}$ is applied to the bases of both transistors 139 and 140. In contrast, in the IFL implementation of FIG. 18, no reference voltage $V_{BB}$ is required. Instead, the level shifted representation B' is applied to the base of transistor 154 and the level shifted representation A' is applied to the base of transistor 158.

Figure 20:
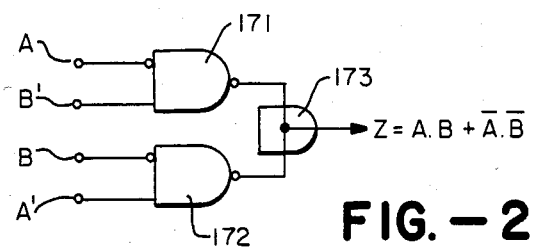
FIG. 20 is the two-input Exclusive NOR circuit of FIG. 19 as implemented with IFL logic gates.
Figure 21:
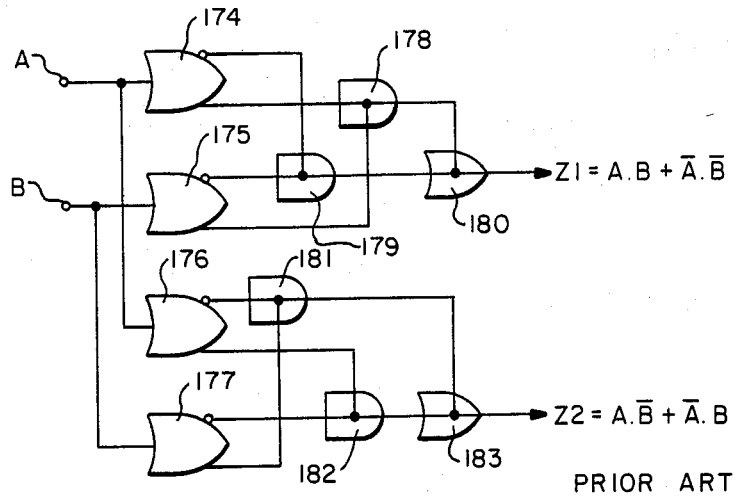
FIG. 21 is an Exclusive OR/Exclusive NOR circuit as implemented in ECL circuitry of the prior art.

The practice of emitter dotting is an analog to the practice of collector dotting, described above. With emitter dotting there is a common connection of emitters to perform an OR function. In combinational logic circuits implemented with inverter function logic, emitter dotting may be eliminated. For example, by comparing the ECL implementation of the combinational logic function $Z1=\overline{A}.\overline{B}.(C+D)$ and $Z2=A+B+\overline{C}.\overline{D}$ with the IFL implementation, it can be seen that emitter dotting is eliminated. Thus, the emitter dotting in OR gate 102, shown in FIG. 11, is not present in the IFL implementation of FIG. 13. Similarly, the emitter dotting present in OR gate 169, shown in FIG. 19, is not present in the IFL implementation, shown in FIG. 20, for the two-input exclusive NOR function. In other comparisons it can be seen that the number of emitter dots is reduced. Thus, by contrasting the ECL implementation for the logic functions $Z1 = A.B + \overline{C}.\overline{D}$ and $Z2 = A.\overline{B} + \overline{A}.B$, it can be seen that one emitter-dotted OR gate is eliminated. Thus, the two emitter-dotted OR gates 180 and 183, shown in FIG. 21, are reduced to a single emitter-dotted OR gate 188, shown in the IFL implementation of FIG. 22. And, the four emitter-dotted OR gates 259, 260, 264 and 265 in the ECL implementation for a full adder, shown in FIG. 29, are reduced to two emitter-dotted OR gates 278 and 279, shown in the IFL implementation of FIG. 30. In some cases, emitter-dotting is not eliminated as can be seen by comparing the ECL implementation of the two-input exclusive OR function, shown in FIG. 15, with the IFL implementation, shown in FIG. 17. It should be noted, however, that the advantage of eliminating diode clamps 144 and 146 is the prime objective of this circuit design, not the elimination of emitter-dotting.

Of the large number of combinational logic circuits which may be implemented with inverter function logic gates, only a selected number have been shown. They range from simple AND functions, shown in FIGS. 3-6, to complex decoders and adders shown in FIGS. 27-30. For each of the AND gate functions, whether implemented in ECL logic or IFL logic, the output is provided by an AND gate, e.g., AND gates 46, 51, 56, and 69 for the ECL prior art gates of FIGS. 3a-6a and AND gates 47, 52, 59, and 65 for the corresponding IFL gates of FIGS. 3b-6b. The differences lie in the virtual elimination of the OR gates used to provide the inputs to the AND gates in the ECL embodiments. The benefit in reduction of complexity is particularly evident by comparing the prior art FIG. 27 with the IFL-based circuit shown in FIG. 28.

The foregoing description of certain combinational logic circuits has been presented for purposes of illustration and description. It is not intended to be exhaustive or to limit the invention to the precise form disclosed, and obviously many modifications and variations of inverter function logic gates as implemented in combinational logic circuits are possible. The particular combinational logic circuits were chosen and described in order to best explain the principles of the invention and its practical application to thereby enable others skilled in the art to best utilize the invention in various embodiments and with various modifications as are suited to the particular use contemplated. It is therefore intended that the scope of the invention be defined by the claims appended hereto.

What is claimed is:

1. A combinational logic circuit comprising:
   at least two respective input lines respectively coupled for receiving respective input signals at conventional ECL levels;
   a forward biased schottky diode;
   a first input transistor including a base coupled to a respective first input line of said at least two input lines;
   first resistor means connected between a collector of said first input transistor and a supply voltage, $V_{CC}$;
   second resistor means coupled to the supply voltage, $V_{CC}$;
   a first level shift bipolar transistor including an emitter connected through said forward biased Schottky diode to an emitter of said first input transistor, including a base coupled to a second input line of said at least two input lines, and including a collector coupled through said second resistor means to the $V_{CC}$ supply voltage, said first level shift transistor producing respective level shifted signal representations of respective input signals received by said second input line; and
   means to perform a combinational logic operation upon the respective input signals received by said first input line and upon the respective level shifted signal representations produced by said first level shift transistor in conjunction with said forward biased Schottky diode.

2. A combinational logic circuit in accordance with claim 1 wherein said means to perform a combinational logic operation includes means to perform a logical operation upon the complement of the respective input signals received by said second input line 3. A combinational logic circuit in accordance with claim 1 and further comprising:
   a second input transistor; and
   a second level shift bipolar transistor;
   wherein said at least two respective input lines further include respective third and fourth input lines for receiving respective input signals at conventional ECL levels;
   wherein said first input line is coupled to receive a logic level B signal;
   wherein said second input line is coupled to receive a logic level C signal;
   wherein said third input line is coupled to receive a logic level A signal;
   wherein said fourth input line is coupled to receive a logic level D signal;
   wherein respective logic levels A, B, C and D each are respectively variable between two logical states;
   wherein said second input transistor includes a base coupled to said third input line and includes a collector coupled through said first resistor means to the supply voltage, $V_{CC}$; and
   wherein said second level shift transistor includes an emitter connected through said forward biased Schottky diode to respective emitters of said respective first and second input transistors, and includes a base coupled to said fourth input line, and includes a collector coupled through said second resistor means to the $V_{CC}$ supply voltage, said second level shift transistor producing, in conjunction with said forward biased Schottky diode, respective level shifted representations of respective input signals received by said fourth input line.

4. A combinational logic circuit in accordance with claim 3 wherein said means to perform a combinational logic operation includes:
   a first output transistor including a base coupled to the respective collectors of said first and second input transistors and coupled through said first resistor means to the supply voltage, $V_{CC}$, including a collector coupled to the supply voltage, $V_{CC}$, and including an emitter coupled through a third resistor means to a low voltage potential, $V_{EE}$, whereby a first output signal is produced corresponding to a combinational logic function $Z_1 = \overline{AB}(C+D)$; and a second output transistor including a base coupled to the respective collectors of said first and second level shift bipolar transistors and coupled through said second resistor means to the supply voltage, $V_{CC}$, including a collector coupled to the supply voltage, $V_{CC}$, and including an emitter coupled through a fourth resistor means to the low potential, $V_{EE}$, whereby a second output signal is produced corresponding to a combinational logic function $Z_2 = A + B + \overline{CD}$.

* * * * *

UNITED STATES PATENT AND TRADEMARK OFFICE
CERTIFICATE OF CORRECTION

PATENT NO. : 4,680,486

DATED : July 14, 1987

INVENTOR(S) : John E. Price

It is certified that error appears in the above-identified patent and that said Letters Patent is hereby corrected as shown below:

Column 8, line 2: "...out the logical functions without having to use an inverter or dual cascode arrangement."
Completely omitted.

Signed and Sealed this

Sixth Day of December, 1988

Attest:

DONALD J. QUIGG

Attesting Officer

Commissioner of Patents and Trademarks